(12) United States Patent
Hsu et al.

(10) Patent No.: US 8,714,227 B2
(45) Date of Patent: May 6, 2014

(54) CHIP SORTING APPARATUS

(75) Inventors: Chen-Ke Hsu, Hsinchu (TW);
Liang-Sheng Chi, Hsinchu (TW);
Chun-Chang Chen, Hsinchu (TW);
Win-Jim Su, Hsinchu (TW);
Hsu-Cheng Lin, Hsinchu (TW);
Mei-Ling Tsai, Hsinchu (TW); Yi Lung Liu, Hsinchu (TW); Chen Ou, Hsinchu (TW)

(73) Assignee: Epistar Corporation, Hsinchu (TW)

( * ) Notice: Subject to any disclaimer, the term of this patent is extended or adjusted under 35 U.S.C. 154(b) by 271 days.

(21) Appl. No.: 12/842,112

(22) Filed: Jul. 23, 2010

(65) Prior Publication Data
US 2011/0017407 A1 Jan. 27, 2011

(30) Foreign Application Priority Data

Jul. 23, 2009 (TW) ................................ 98124963 A

(51) Int. Cl.
*B32B 38/10* (2006.01)
(52) U.S. Cl.
USPC ........... 156/753; 156/703; 156/712; 156/716; 156/765; 156/932; 156/943
(58) Field of Classification Search
USPC .......... 156/703, 712, 716, 753, 765, 932, 943
See application file for complete search history.

(56) References Cited

U.S. PATENT DOCUMENTS

| 4,990,051 | A | * | 2/1991 | Safabakhsh et al. | .......... 156/707 |
| 5,589,029 | A | * | 12/1996 | Matsui et al. | .................. 156/765 |
| 5,971,250 | A | * | 10/1999 | Safabakhsh et al. | .......... 228/102 |
| 6,629,553 | B2 | * | 10/2003 | Odashima et al. | ............. 156/765 |
| 6,709,543 | B2 | * | 3/2004 | Kurosawa | ....................... 156/765 |
| 6,824,643 | B2 | * | 11/2004 | Yoshimoto et al. | ........... 156/765 |
| 6,896,762 | B2 | * | 5/2005 | Huang et al. | .................. 156/765 |
| 7,303,647 | B2 | * | 12/2007 | Cheung et al. | ................ 156/765 |
| 7,445,688 | B2 | * | 11/2008 | Suzuki et al. | .................. 156/765 |
| 2004/0238117 | A1 | * | 12/2004 | Kasai | .............................. 156/344 |
| 2008/0008565 | A1 | * | 1/2008 | Thallner | ..................... 414/217.1 |
| 2008/0227239 | A1 | * | 9/2008 | Shibata et al. | ................. 438/110 |

FOREIGN PATENT DOCUMENTS

CN 101009230 A 8/2007
EP 0298496 A2 1/1989

* cited by examiner

*Primary Examiner* — Mark A Osele
*Assistant Examiner* — Nickolas Harm
(74) *Attorney, Agent, or Firm* — Patterson & Sheridan, LLP

(57) ABSTRACT

A chip sorting apparatus comprising a chip holder comprising a first surface and an second surface opposite to the first surface; a wafer comprising a first chip disposed on a first position of the first surface; a first chip receiver comprising a third surface and an fourth surface opposite to the third surface, wherein the third surface is opposite to the first surface; a pressurization device making the first chip and the third surface of the first chip receiver adhered to each other through pressuring the second surface at where corresponding to the first position; and a separator decreasing the adhesion between the first chip and the first surface.

22 Claims, 9 Drawing Sheets

CHIP SORTING APPARATUS

BACKGROUND

1. Technical Field

The present application relates to a chip sorting apparatus and the sorting method thereof.

2. Description of the Related Art

In a semiconductor process, each wafer has to go through a multiple or hundreds of procedures. A plurality of defined regions is formed on the wafer to be diced into a plurality of chips. These defined regions subject to a series of tests before or after chip dicing. For example, in the light-emitting diode manufacture process, the wafer goes through the evaporation process for forming electrodes and the lithography and etching process for forming scribing lines to separate the wafer into chips. After running a probe test in the chips, the testing data is written as a code in a wafer map file, and those chips meet the customers' or users' requirement are sorted according to the wafer map file. A sorter chooses the qualified chips by the wafer map file corresponding to the chips, and put the qualified chips on a bin table one by one until finishing the sorting. It takes a lot of time for the machine arm of the sorter to work back and forth during the sorting process. For example, a commercial sorter can choose four chips per second, so it takes about three hours to sort forty thousand chips from wafers which decreasing the production efficiency.

SUMMARY OF THE DISCLOSURE

A chip sorting apparatus comprises a chip holder including a first surface and a second surface opposite to the first surface; a wafer including a first chip disposed on a first position of the first surface; a first chip receiver including a third surface and a fourth surface opposite to the third surface, wherein the third surface is opposite to the first surface; a pressurization device making the first chip and the third surface of the first chip receiver adhering to each other through pressuring the second surface at where corresponding to the first position; and a separator decreasing the adhesion between the first chip and the first surface.

A chip sorting method comprises providing a chip holder comprising a first surface and a second surface opposite to the first surface; attaching a wafer including a first chip to a first position of the first surface; providing a first chip receiver comprising a third surface and a fourth surface opposite to the third surface, wherein the third surface is opposite to the first surface; moving the chip holder and/or the first chip receiver to place the third surface of the first chip receiver facing the first surface of the chip holder; providing a pressurization device; driving the pressurization device to make the first chip and the third surface adhering to each other through pressuring the second surface at where corresponding to the first position; providing a separator; and driving the separator to act on the chip holder to decrease the adhesion between the first chip and the first surface of the chip holder.

BRIEF DESCRIPTION OF THE DRAWINGS

The accompanying drawings are included to provide easy understanding of the application, and are incorporated herein and constitute a part of this specification. The drawings illustrate embodiments of the application and, together with the description, serve to illustrate the principles of the application.

DESCRIPTION OF THE PREFERRED EMBODIMENTS

Figure 1:
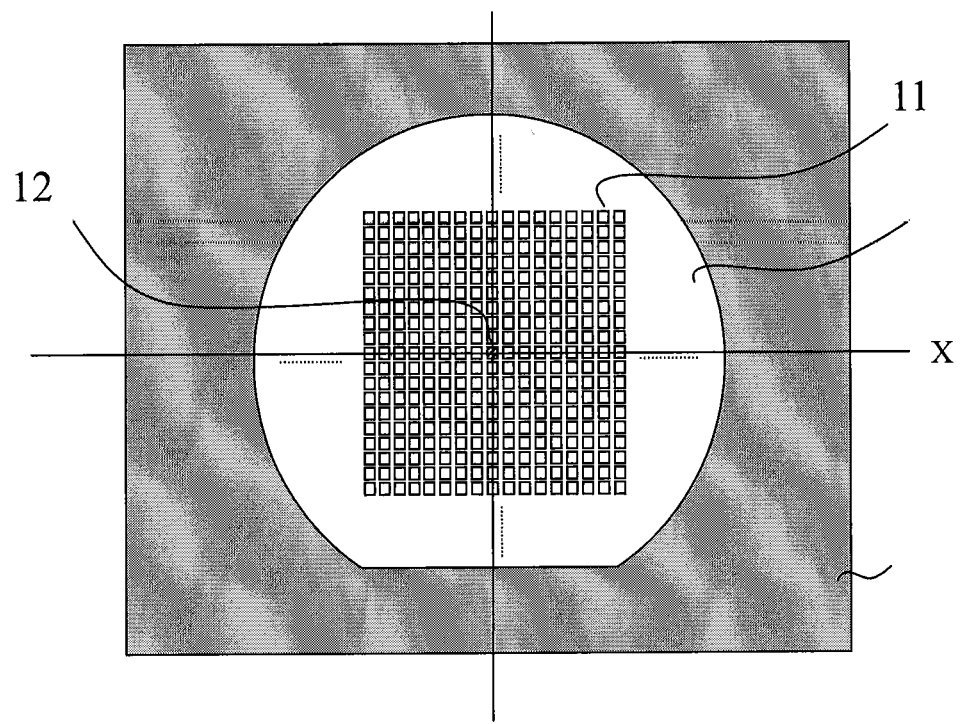
FIG. 1 illustrates a top view of the chip sorting apparatus in accordance with one embodiment of the present application.

Reference is made in detail to the preferred embodiments of the present application, examples of which are illustrated in the accompanying drawings. Wherever possible, the same reference numbers are used in the drawings and the description to refer to the same or like parts.

Refer to FIGS. 1-6. FIG. 4A illustrates a schematic view of a chip sorting apparatus 110 in accordance with one embodiment of the present application. The chip sorting apparatus 110 includes a wafer 10, a chip holder 20, a chip receiver 50, a pressurization device 70, and a separator 80. FIG. 1 illustrates a part of the top view of the chip sorting apparatus 110. In FIG. 1, the wafer 10 includes a plurality of defined regions for chip. The plurality of defined regions for chip are defined by lithography and etching processes and then cut into a plurality of separated chips 11. A center chip 12 is disposed on the center of the wafer 10. The center chip 12 includes a pattern used for positioning in the following processes. The wafer 10 is disposed on the chip holder 20 after cutting. The material of the chip holder 20 can be an adhesive material such as blue tapes or UV tapes. In the embodiment, the blue tape is used as the chip holder 20. The aforementioned cutting process can also be performed after attaching the wafer 10 to the blue tape. In the chip sorting apparatus 110, the X/Y coordinates of each chip are defined by referring the center chip 12 as the origin. The optoelectronic data of each chip, such as wavelength, luminance, driving voltage, and/or current, has been built up and stored in the wafer map file during the test process. The position of each chip on the blue tape is arranged according to the defined coordinates during the test process. The surface of chip adhered on the tape can be the front surface or back surface of the chip.

Figure 2:
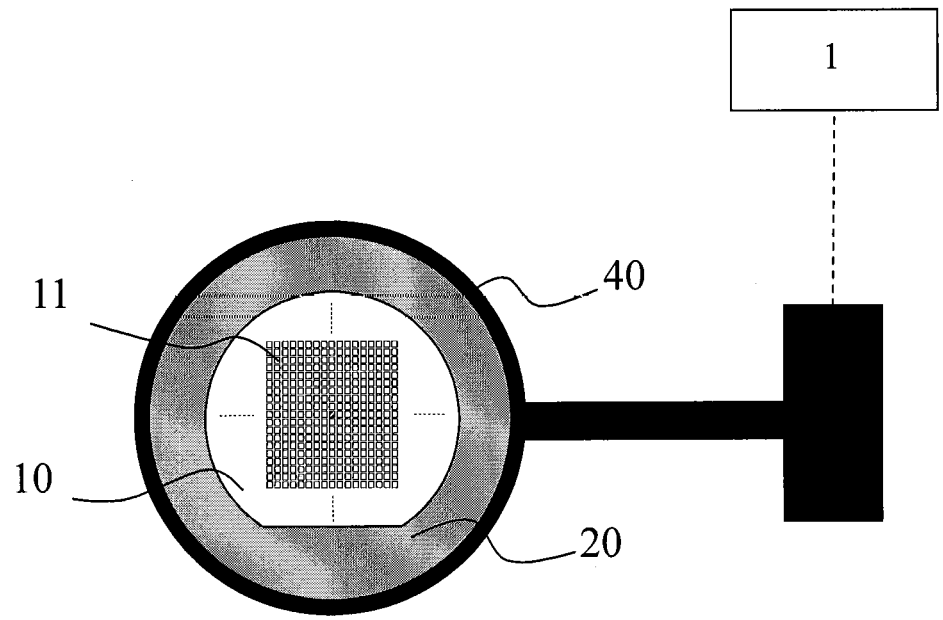
FIG. 2 illustrates a top view of the chip sorting apparatus in accordance with one embodiment of the present application.
Figure 3:
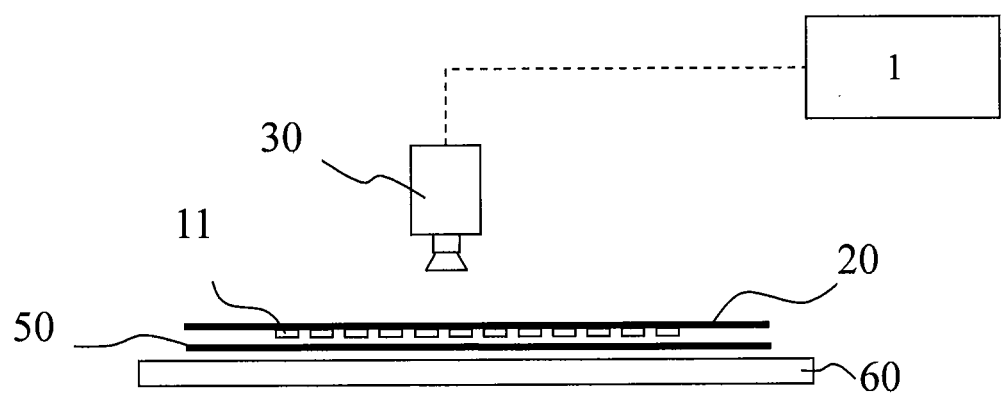
FIG. 3 illustrates a cross-sectional view of the chip sorting apparatus in accordance with one embodiment of the present application.

Refer to FIGS. 2 and 3. FIG. 2 illustrates a part of the top view of the chip sorting apparatus 110, and FIG. 3 illustrates a part of the side view of the chip sorting apparatus 110. After the wafer 10 is adhered to the tape, the wafer 10 can be fixed on a first plane table 40. In the embodiment, the first plane table 40 is an expansion ring connected with the chip holder 20 exposing the wafer 10 and the chip holder 20. The chip sorting apparatus 110 further comprises a chip positioner 30 to adjust the wafer to a predetermined position. In the embodiment the chip positioner 30 is an image recognition machine to position the chips on the wafer 10. The image recognition machine is disposed above the chip holder 20. Turning the surface of the wafer 10 not adhered to the tape upside down to fix the wafer 10 with the first plane table 40. The chip 11 is positioned with the center chip 12 as the origin of the coordinates and driving the first plane table 40 according to a signal 1 from the chip positioner 30 to move the wafer 10 to a predetermined position.

In one embodiment, the first plane table 40, such as an expansion ring, is fixed in a range that the chip positioner 30 is able to recognize. After fixing the chip holder 20, the position of the center chip 12 and the relative position of chip 11 are recognized through the chip positioner 30 to finish the chip positioning.

The first chip receiver 50 is disposed on a second plane table 60 under the wafer 10 and can be an adhesive tape, such as a blue tape or a UV tape. In the embodiment, the chip receiver 50 is a blue tape used to collect the sorted chip from the proceeding processes. The area of the blue tape is greater than or equal to that of the wafer 10, and the position of the blue tape is under the wafer 10 where the chips sorted from the wafer 10 can be collected completely.

In one embodiment, the difference to the above embodiments is the chip receiver 50 and the second plane table 60 can be transparent or semi-transparent. The image recognition machine can be disposed under the chip receiver 50 and the second plane table 60, and the wafer 10 can be positioned through seeing through the chip receiver 50 and the second plane table 60.

In one embodiment, the first plane table 40 is fixed in a predetermined position which has to be in a recognizable region to the chip positioner 30. Next, the chip holder 20 is moved to the first plane table 40, adjusted into the recognizable region of the chip positioner 30, and fixed on the first plane table 40. The chip positioner 30 then recognizes the position of the center chip 12 and the relative position of other chips to finish the chip positioning.

Figure 4A:
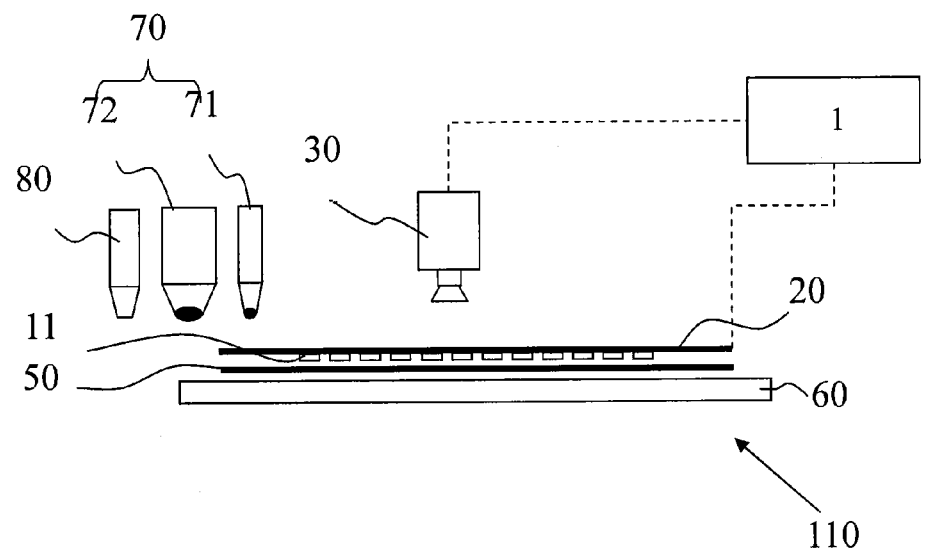
FIGS. 4A-4F illustrate a process of the chip sorting method in accordance with one embodiment of the present application.
Figure 4B:
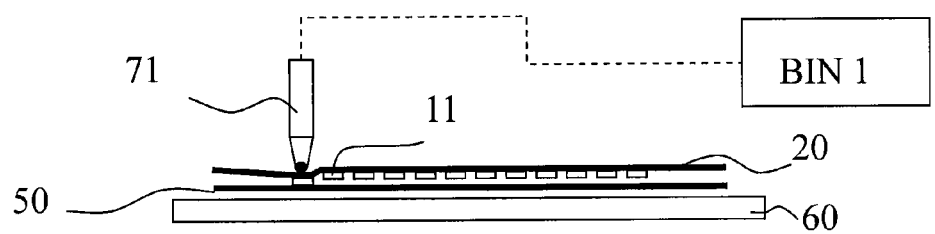
Figure 4C:
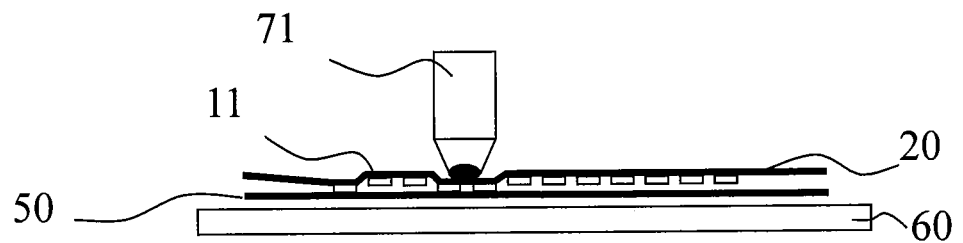

The chip sorting apparatus 110 further comprises the pressurization device 70 and the separator 80. Referring to FIG. 4A, in the embodiment, the pressurization device 70 includes two pressurization pens 71 and 72. In the chip sorting process, the wafer map file produced from a probing test includes the optoelectronic data of each chip, and the chips can be selected according to the optoelectronic data that satisfies the customers' requirement. Then the position data of these chips satisfying the customers' requirement are transferred to the pressurization device 70 through the chip positioner 30 to drive the pressurization device 70 pressurizing on a position of the chip holder 20 corresponding to the selected chip, and the surfaces of the selected chips not contacted to the chip holder 20 is contacted with the chip receiver 50. The pressurization device 70 can choose different pressurization pens with different size according to the chip size. In the embodiment, the chip receiver 50 is a blue tape. The pressurization pen 71 with large size is for large chip, and the pressurization pen 72 with small area is for small chip.

Then, the adhesion between the chip 11 and the chip holder 20 can be decreased through the separator 80. In the embodiment, the separator 80 is a liquid spreading apparatus such as an injector which can spread an adhesive-removal solvent 81 such as acetone on the region the pressurization device 70 pressuring on, and it can decrease the adhesion between the selected chip and the chip holder 20. Then the chip holder 20 is moved to separate the selected chip from the chip holder 20. The separated chip 13 is attached on the chip receiver 50 which is a blue tape and the first separating process is finished.

FIGS. 4A-4F illustrate the chip sorting method in accordance with the first embodiment of the present application. The method includes steps as follows. First, providing the wafer 10 including a substrate for manufacturing LEDs. The material of the substrate includes sapphire, silicon, GaP, GaAs, AlN or GaN. In the embodiment, the wafer 10 is a two inch GaN wafer including the plurality of chips 11. Each chip is surrounded by a plurality of scribing lines, and the center chip 12 is disposed on the center of the wafer 10. The wafer is disposed on the chip holder 20. In the embodiment, the chip holder 20 is a blue tape, and the wafer 10 is attached on the blue tape through the adhesion of the blue tape. Next, the chips on the wafer 10 are positioned through the chip positioner 30. In the embodiment, the chip positioner 30 is an image recognition machine. The surface of the wafer 10 not adhered to the tape is turned upside down and connected with the first plane table 40. The center chip 12 is disposed on a predetermined position and the relative position of the chip 11 is recognized by moving the first plane table 40 according to the signal 1 from the image recognition machine to finish the chip positioning process. Then the chip receiver 50 is provided under the wafer 10 wherein the chip receiver 50 is a blue tape.

The next step is chip sorting. Referring to above content, the wafer map file is generated during the probe test process. The chip is selected according to a first optoelectronic data in the wafer map file satisfying the customer's requirement, and the selected chips is collected on the chip receiver 50. In the embodiment, the qualified chip is represented by the symbol BIN 1. If the customer has another requirement, the chips with a second optoelectronic characteristic satisfying such requirement are selected according to the datum in the wafer map file, which is represented by the symbol BIN 2. Referring to FIGS. 4A-4C and 5, FIG. 5 is a top view of FIG. 4B. The position data of the chips categorized to BIN 1 is transferred to the pressurization device 70, a suitable pen is then selected by determining the chip size of the BIN 1 chips from the input data, and the pressurization device 70 is driven for the pressurization pen pressures on a position of the chip holder 20 corresponding to the position of the BIN 1 chips to make the surface not contacted to the chip holder 20 to be contacted with the blue tape of the chip receiver 50.

Figure 4D:
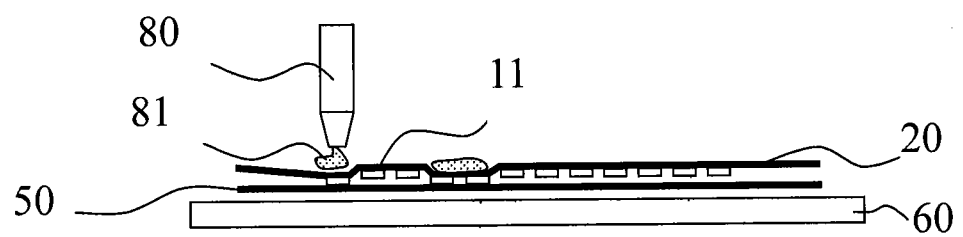
Figure 4E:
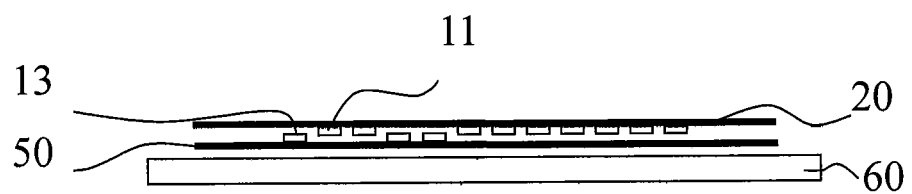

Referring to FIGS. 4D-4E, the chip 10 is separated from the chip holder 20 by the separator 80. In the embodiment, the separator 80 is a liquid spreading apparatus like an injector which can spread an adhesive-removal solvent 81 like acetone on where the pressurization device 70 pressuring on. The acetone infiltrates into the adhesion surface between the chip holder 20 and the BIN 1 chips, and decreases the adhesion of the blue tape. Then the second plane table 60 is moved with the chip holder 20. The adhesion between the chip receiver 50 and the chips is greater than that between the chip holder 20 and the chips after the acetone is spread, so it is easy to separate the chips from the chip holder 20 by moving the second plane table 60. The separated BIN 1 chips 13 are attached on the blue tape of the chip receiver 50 and the first separating process is finished.

Figure 4F:
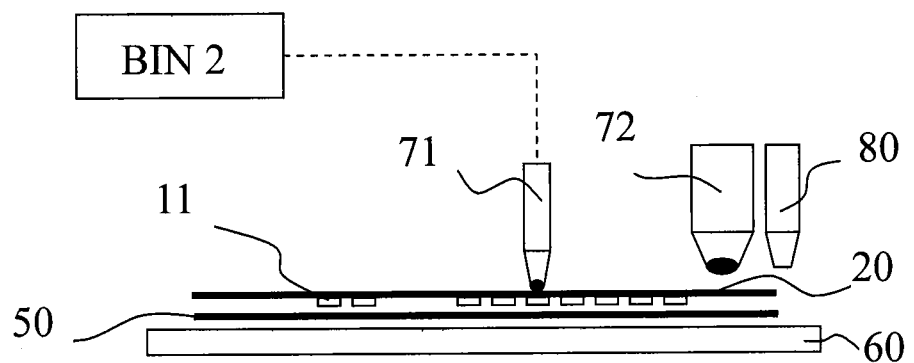
Figure 5:
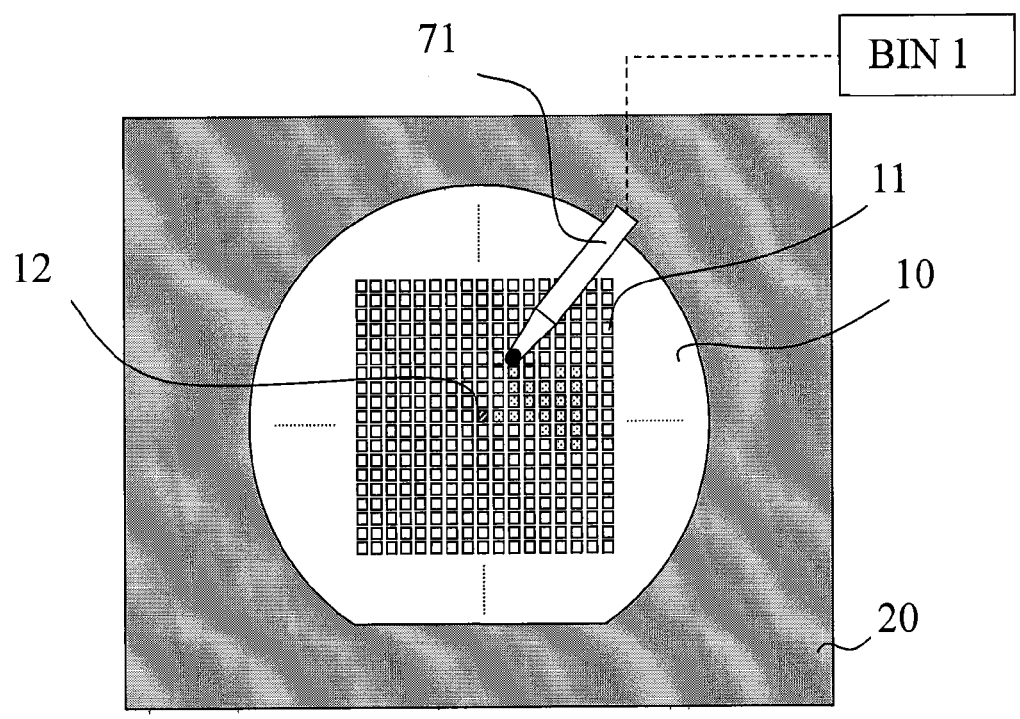
FIG. 5 illustrates a top view of the chip sorting apparatus in accordance with one embodiment of the present application.
Figure 6:
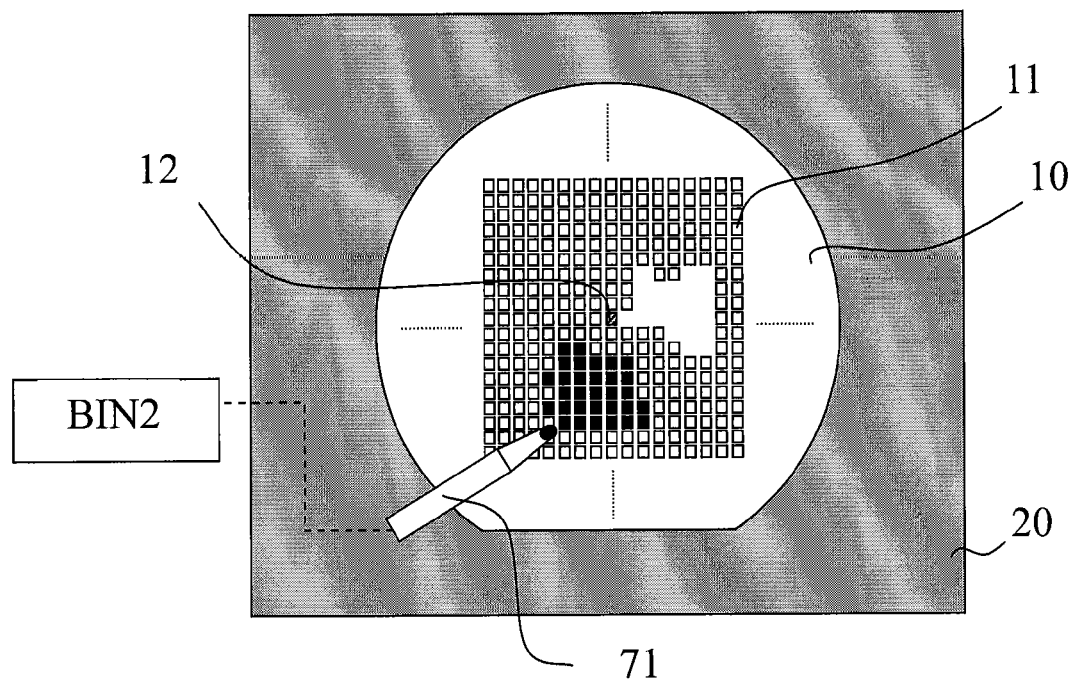
FIG. 6 illustrates a top view of the chip sorting apparatus in accordance with one embodiment of the present application.

Refer to FIGS. 4F and 6. FIG. 6 is a top view of FIG. 4F. The next step is replacing a new blue tape by moving the second plane table 60, and repeating above chip sorting steps to proceed for sorting the BIN 2 chips. The chips with a third optoelectronic characteristic according customers' requirement can be sorted out from the remaining chips on the chip holder 20, and take three pieces of blue tapes orderly as the chip receivers for repeating the above chip sorting steps to finish the chip sorting. The number of the chip receiver 50 depends on the number of sorting steps.

In one embodiment, after the acetone is spread, the adhesion between the BIN 1 chips and the chip holder 20 is decreased, and the blue tape for the chip holder 20 or the blue tape for the chip receiver 50 can be torn off by hand. The BIN 1 chips are adhered on the blue tape of the chip receiver 50, and other chips are left on the blue tape of the chip holder 20. The chip sorting is finished, and the other chip sorting can be proceeded.

Figure 7:
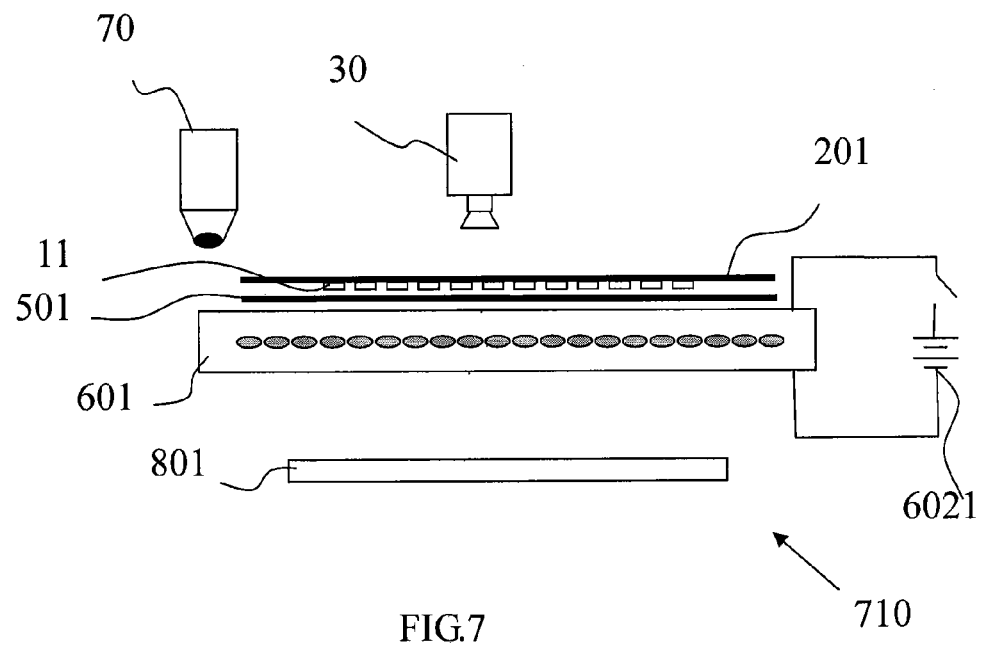
FIGS. 7-10 illustrate a process of the chip sorting method in accordance with one embodiment of the present application.

Referring to FIG. 7, it illustrates a schematic view of a chip sorting apparatus 210 in accordance with one embodiment of the present application. A chip holder 201 is a UV tape. A chip receiver 501 is a non-UV tape, and the better type is the tape with an adhesion that can not be decreased through the UV light. The adhesion between the chip holder 201 and the chip 11 is greater than that between the chip receiver 501 and the chip 11. In the embodiment, the chip receiver 501 is disposed on a second plane table 601. The second plane table 601 can be a liquid crystal panel including two conductive glass sheets and liquid crystal material interposed between thereof, and includes a current controller 602.

Figure 8:
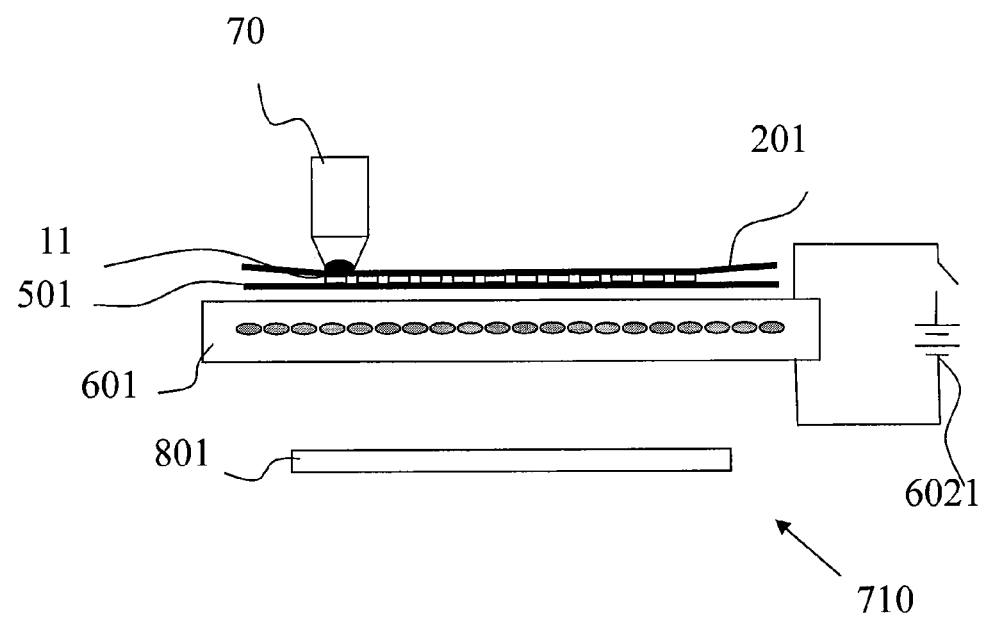
Figure 9:
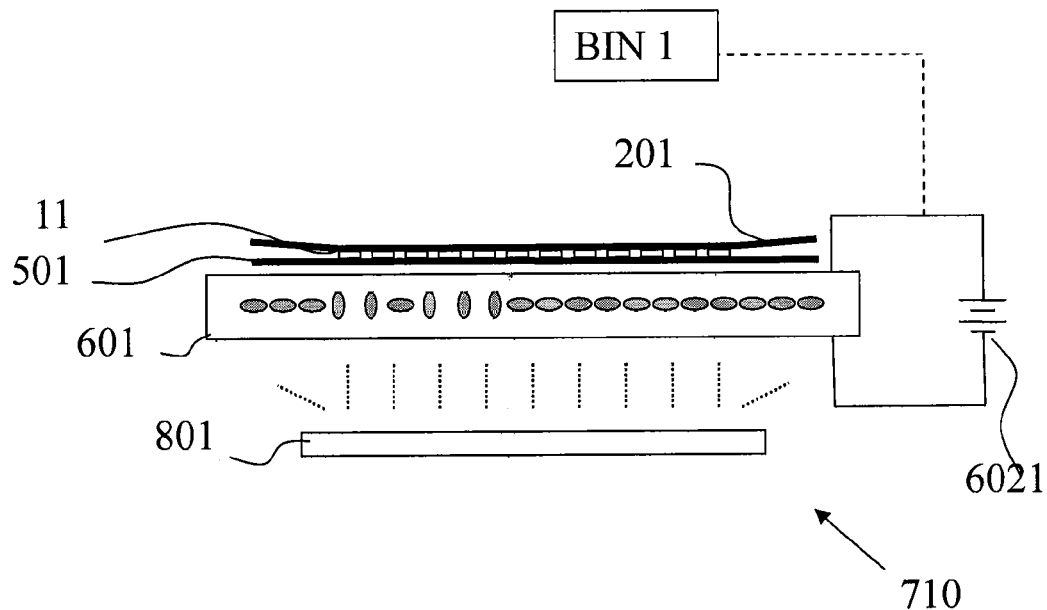
Figure 10:
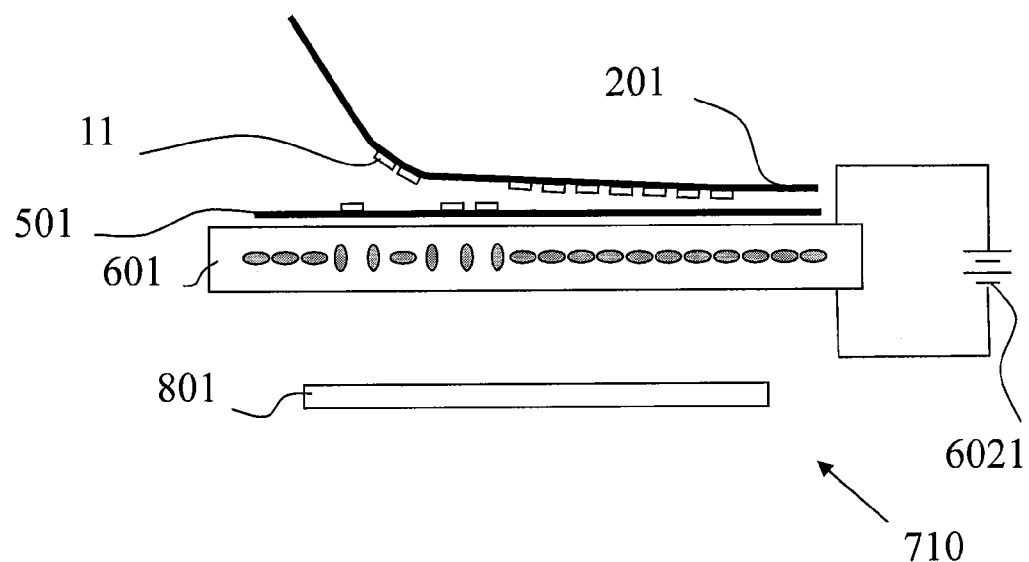

Referring to FIGS. 8 and 9, all chips 11 are adhered to the chip receiver 501 through the pressurization device 70, and meanwhile chips 11 are also adhered to the chip holder 201. A UV light transmitter used as a separator 801 is disposed under the liquid crystal panel. Transmitting the coordinate of the BIN 1 chip to the current controller 602 to control the conductive region of the conductive glass sheets, so as to control the spin degree of liquid crystal. The liquid crystal disposed under the BIN 1 chip can spin to an orientation perpendicular to the conductive glass sheet to form a turn-on path without the liquid crystal in-between. Next, the UV light emitted from the UV light transmitter can pass through the turn-on path, the glass sheet, the chip receiver 501, BIN 1 chips without being barred by the liquid crystal and then is emitted on the chip holder 201, and the adhesion of the chip holder 201 made of the UV tape is decreased because of the UV light. Referring to FIG. 10, chips other than BIN 1 chips and the chip holder 201 are removed from the chip receiver 501, such as tearing off the chip holder 201 made of the UV tape by hand. Because the adhesion between the UV blue tape without being emitted by light and the chip 11 is greater than that between the chip receiver 501 and the chip 11, the chips other than BIN 1 chips are separated from the chip receiver 501 when the UV tape is torn off. Only BIN 1 chips are left on the chip receiver 501, and the first sorting is finished. Next, replacing a chip receiver 501 to proceed with BIN 2 chip sorting.

Those having ordinary skill in the art will readily observe that numerous modifications and alterations of the device and method may be made while retaining the teachings of the invention. Accordingly, the above disclosure should be construed as limited only by the metes and bounds of the appended claims.

What is claimed is:

1. A chip sorting apparatus comprising:
   a chip holder comprising a first surface and a second surface opposite to the first surface;
   a wafer comprising a first chip disposed on a first position of the first surface;
   a first chip receiver comprising a third surface and a fourth surface opposite to the third surface, wherein a distance between the third surface and the first surface is smaller than a distance between the fourth surface and the first surface, wherein the first chip receiver comprises an adhesive;
   a pressurization device on the second surface of the chip holder; and
   a separator, distinct from the first chip receiver and the pressurization device, capable of decreasing an adhesion between the first chip and the first surface, wherein the separator comprises a UV light transmitter disposed on a fourth surface side of the first chip receiver.

2. The chip sorting apparatus according to claim 1, further comprising a chip positioner.

3. The chip sorting apparatus according to claim 2, wherein the chip positioner comprises an image recognition machine.

4. The chip sorting apparatus according to claim 3, wherein the image recognition machine is disposed above a second surface side of the chip holder or the fourth surface side of the first chip receiver.

5. The chip sorting apparatus according to claim 1, wherein the chip holder or the first chip receiver is a blue tape or an UV tape.

6. The chip sorting apparatus according to claim 1, wherein the wafer comprises a plurality of chips.

7. The chip sorting apparatus according to claim 6, wherein a center chip is disposed on the center of the wafer, and the center chip comprises a pattern used for positioning.

8. The chip sorting apparatus according to claim 7, wherein the wafer is connected with a plane table and the wafer is moved to a predetermined position by driving the plane table.

9. The chip sorting apparatus according to claim 1, wherein the wafer further comprises a second chip disposed on a second position of the first surface of the chip holder.

10. The chip sorting apparatus according to claim 9, wherein both of the first chip and the second chip comprise the same optoelectronic characteristic.

11. The chip sorting apparatus according to claim 10, wherein the optoelectronic characteristic comprises luminance, wavelength, driving voltage, or current.

12. The chip sorting apparatus according to claim 1, wherein the wafer comprises a substrate for manufacturing LEDs, wherein the material of the substrate comprises sapphire, silicon, GaP, GaAs, AlN or GaN.

13. The chip sorting apparatus according to claim 1, further comprising a first plane table on which the chip holder is disposed.

14. A chip sorting apparatus comprising:
   a chip holder comprising a first surface and a second surface opposite to the first surface;
   a wafer comprising a first chip disposed on a first position of the first surface;
   a first chip receiver comprising a third surface and a fourth surface opposite to the third surface, wherein a distance between the third surface and the first surface is smaller than a distance between the fourth surface and the first surface, wherein the first chip receiver comprises an adhesive;
   a pressurization device on the second surface of the chip holder;
   a separator, distinct from the first chip receiver and the pressurization device, capable of decreasing an adhesion between the first chip and the first surface, wherein the separator comprises a liquid spreading apparatus.

15. The chip sorting apparatus according to claim 14, wherein the liquid spreading apparatus comprises an injector.

16. A chip sorting apparatus comprising:
   a chip holder comprising a first surface and a second surface opposite to the first surface;
   a wafer comprising a first chip disposed on a first position of the first surface;
   a first chip receiver comprising a third surface and a fourth surface opposite to the third surface, wherein a distance between the third surface and the first surface is smaller than a distance between the fourth surface and the first surface, wherein the first chip receiver comprises an adhesive;
   a pressurization device on the second surface of the chip holder;

a separator, distinct from the first chip receiver and the pressurization device, capable of decreasing an adhesion between the first chip and the first surface; and a second plane table on which the first chip receiver is disposed, wherein the second plane table comprises a liquid crystal display.

17. The chip sorting apparatus according to claim 16, wherein the chip holder comprises a UV tape.

18. The chip sorting apparatus according to claim 17, wherein the liquid crystal display comprises two conductive glass sheets and a liquid crystal material interposed therebetween; after being driven by current, the liquid crystal corresponding to the first position of the first chip spins to an orientation perpendicular to the two conductive glass sheets to form a turn-on path without the liquid crystal in-between, an UV light emitted from the UV light transmitter can pass through the turn-on path and then is emitted on where the first chip receiver is contacted with the first chip.

19. The chip sorting apparatus according to claim 18, wherein an adhesion between the adhesive and the wafer is less than an adhesion between the chip holder without being exposed to the UV light and the wafer.

20. The chip sorting apparatus according to claim 18, wherein the wafer further comprises a second chip adhered to the third surface.

21. The chip sorting apparatus according to claim 20, wherein the first chip and the second chip comprise the same optoelectronic characteristic.

22. The chip sorting apparatus according to claim 21, wherein the optoelectronic characteristic comprises luminance, wavelength, driving voltage, and/or current.

* * * * *